United States Patent
Uchida

(10) Patent No.: US 6,720,223 B2
(45) Date of Patent: Apr. 13, 2004

(54) POWER

(75) Inventor: Hironori Uchida, Gunmaken (JP)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/135,469

(22) Filed: Apr. 30, 2002

(65) Prior Publication Data

US 2003/0203562 A1 Oct. 30, 2003

(51) Int. Cl.[7] .............................................. H01L 21/336
(52) U.S. Cl. .................... 438/301; 438/306; 438/227
(58) Field of Search ......................................... 438/133

(56) References Cited

U.S. PATENT DOCUMENTS

| | | | |
|---|---|---|---|
| 5,006,476 A | * | 4/1991 | De Jong et al. ............ 438/234 |
| 5,541,629 A | | 7/1996 | Saunders et al. |
| 5,739,572 A | | 4/1998 | Noguchi |
| 5,830,790 A | | 11/1998 | Kim et al. |
| 5,843,796 A | * | 12/1998 | Disney ........................ 438/133 |
| 5,850,360 A | * | 12/1998 | Vajana et al. ............... 365/181 |
| 5,880,502 A | | 3/1999 | Lee et al. |
| 5,946,012 A | | 8/1999 | Courian et al. |
| 5,966,608 A | | 10/1999 | Gong et al. |
| 6,040,601 A | | 3/2000 | Gong et al. |
| 6,043,534 A | | 3/2000 | Sogo |
| 6,130,133 A | | 10/2000 | Tung |
| 6,133,606 A | | 10/2000 | Tung |
| 6,262,459 B1 | | 7/2001 | Tung |
| 6,306,700 B1 | | 10/2001 | Yang |
| 6,329,233 B1 | * | 12/2001 | Pan et al. ................... 438/199 |

OTHER PUBLICATIONS

Basin, C et al., "High–Voltage CMOS Devices Compatible with Standard Low–Voltage CMOS Technologies," Internet http://legwww.epfl.ch/research/pd/cmos_hvf.pdf.

"High Voltage CMOS Solutions," AMIS Foundry Services website, Internet http://www.amis.com/foundry/cmos.cfm.

Nandra, Navraj S., "High Voltage Sub–micron CMOS Technology Challenges," May 19, 2000, internet http:www.e-wh.ieee.org/r6/scv/scv_sscmay2000.html.

* cited by examiner

Primary Examiner—David Nelms
Assistant Examiner—Thao P Le

(57) ABSTRACT

A method of manufacturing a power switching transistor for a fluid ejection device includes forming a diffused drain region and a diffused source region separated by a channel region. The diffused drain region and the diffused source region are doped with a first dopant. A first portion of the diffused drain region is doped with a second dopant, such that the first portion of the diffused drain region has a greater impurity concentration than at least a second portion of the diffused drain region and has a greater impurity concentration than the diffused source region.

8 Claims, 12 Drawing Sheets

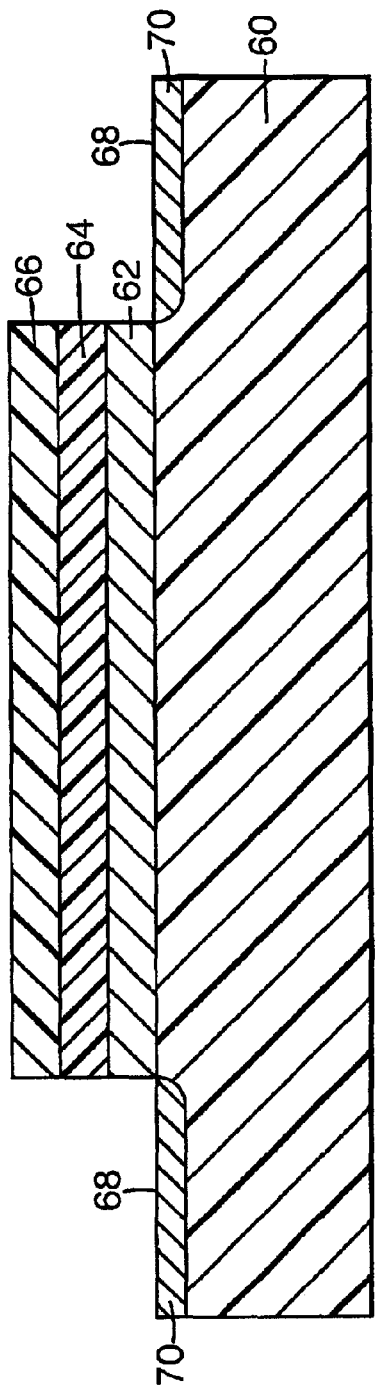
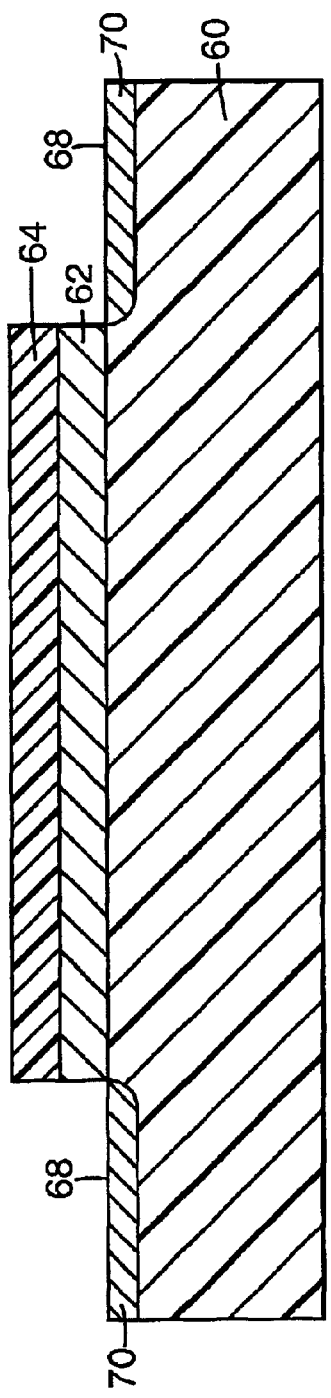
Fig. 4C
Fig. 4D

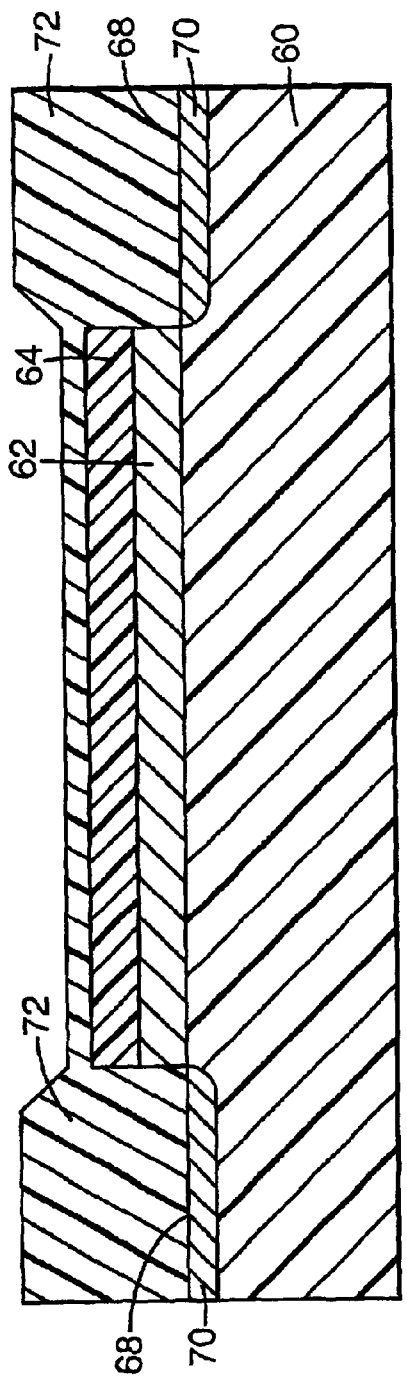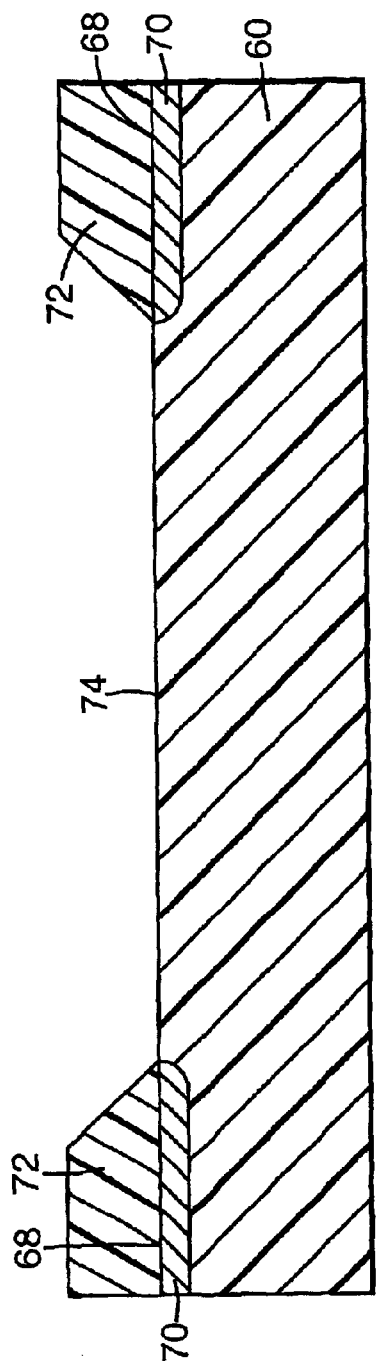
Fig. 4E
Fig. 4F

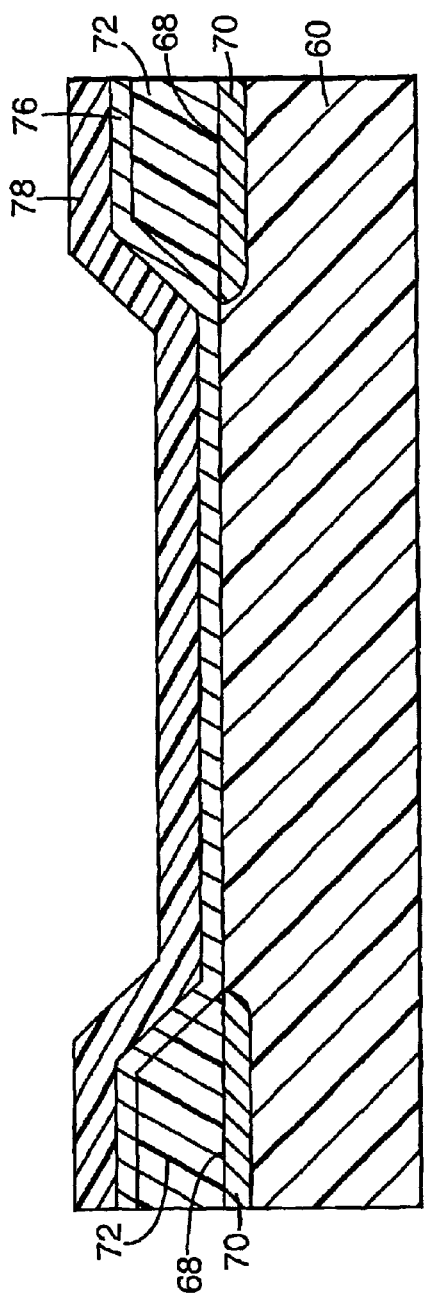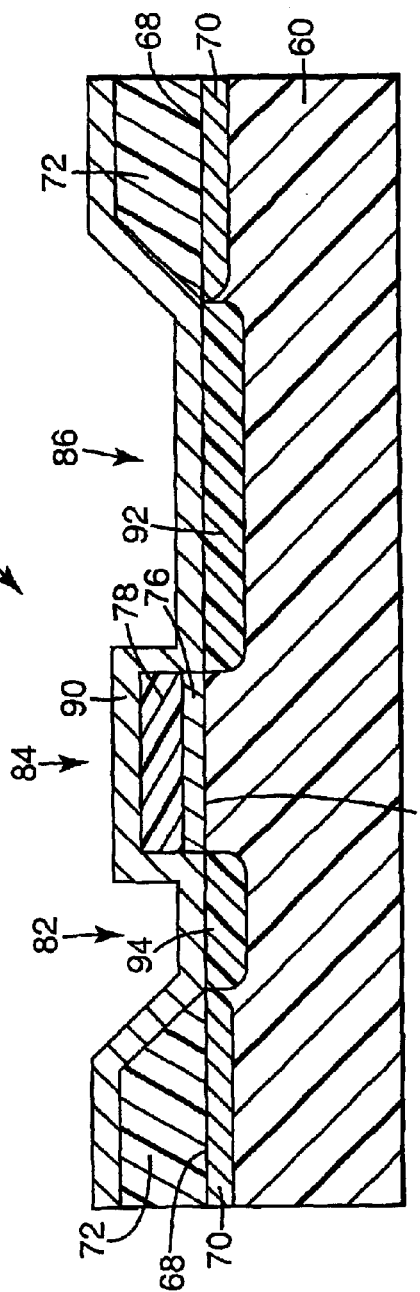

POWER

THE FIELD OF THE INVENTION

The present invention relates generally to fluid ejection devices, and more particularly to a power switching transistor for a fluid ejection device.

BACKGROUND OF THE INVENTION

One type of conventional fluid ejection system is an inkjet printing system which includes a printhead, an ink supply which supplies liquid ink to the printhead, and an electronic controller which controls the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

Typically, the printhead ejects the ink drops through the nozzles by rapidly heating a small volume of ink located in vaporization chambers with small electric heaters, such as thin film resistors. Heating the ink causes the ink to vaporize and be ejected from the nozzles. Typically, for one dot of ink, a remote printhead controller typically located as part of the processing electronics of a printer, controls activation of an electrical current from a power supply external to the printhead. The electrical current is passed through a selected thin film resistor to heat the ink in a corresponding selected vaporization chamber.

In one type of printhead, a power switching device, such as a field effect transistor (FET), is coupled to each thin film resistor to control the application of the electrical current through the thin film resistors. Power is supplied to the thin film resistors via a power supply, which is included as part of the inkjet printing system.

The sales market for inkjet printing systems is very competitive. As such, to be successful, manufacturers must price these systems as low as possible and must use the lowest cost components available. If the FETs could operate at higher voltages, lower cost and lower current drive power supplies could be used in combination with higher resistance thin film resistors. This is because to heat the ink, FETs supply power to the thin film resistors where power consumed by the thin film resistors is equal to $I^2R$ or $VI$, where I is the current through the thin film resistor, R is the value of the thin film resistor and V is the operating voltage supplied to the FET. The turn-on energy of a printhead is herein defined to be the amount of energy that is sufficient to cause drop ejection from nozzles of the print head and is equal to power multiplied by time, where time is measured as the pulse width of a fire pulse employed for controlling the timing of the activation of electrical current through the thin film resistor. Thus, higher operating voltages and/or higher resistance thin film resistors reduce the current required to reach the turn-on energy of the printhead.

The FETs are typically obtained from semiconductor manufacturers using well established semiconductor processes in order to achieve the lowest possible unit prices. Increasing the operating voltage levels for the FETs typically requires additional processing steps. Because the unit price of the FETs must be competitive at high manufacturing volumes, variations in semiconductor processes such as design rule or process step changes are avoided.

For reasons stated above and for other reasons presented in greater detail in the Detailed Description section of the present specification, an approach is desired which will enable the manufacturers to use low cost power supplies by improving the operating voltage level of the FETs.

SUMMARY OF THE INVENTION

One aspect of the present invention provides a method of manufacturing a power switching transistor for a fluid ejection device. The method includes forming a diffused drain region and a diffused source region separated by a channel region. The method further includes doping the diffused drain region and the diffused source region with a first dopant. Further, the method includes doping a first portion of the diffused drain region with a second dopant such that the first portion of the diffused drain region has a greater impurity concentration than at least the second portion of the diffused drain region and has a greater impurity concentration than the diffused source region.

BRIEF DESCRIPTION OF THE DRAWINGS

FIGS. 4A–4J are cross-sectional views that illustrate sequentially the switching transistor fabrication method according to embodiments of the present invention.

DETAILED DESCRIPTION

Figure 1:
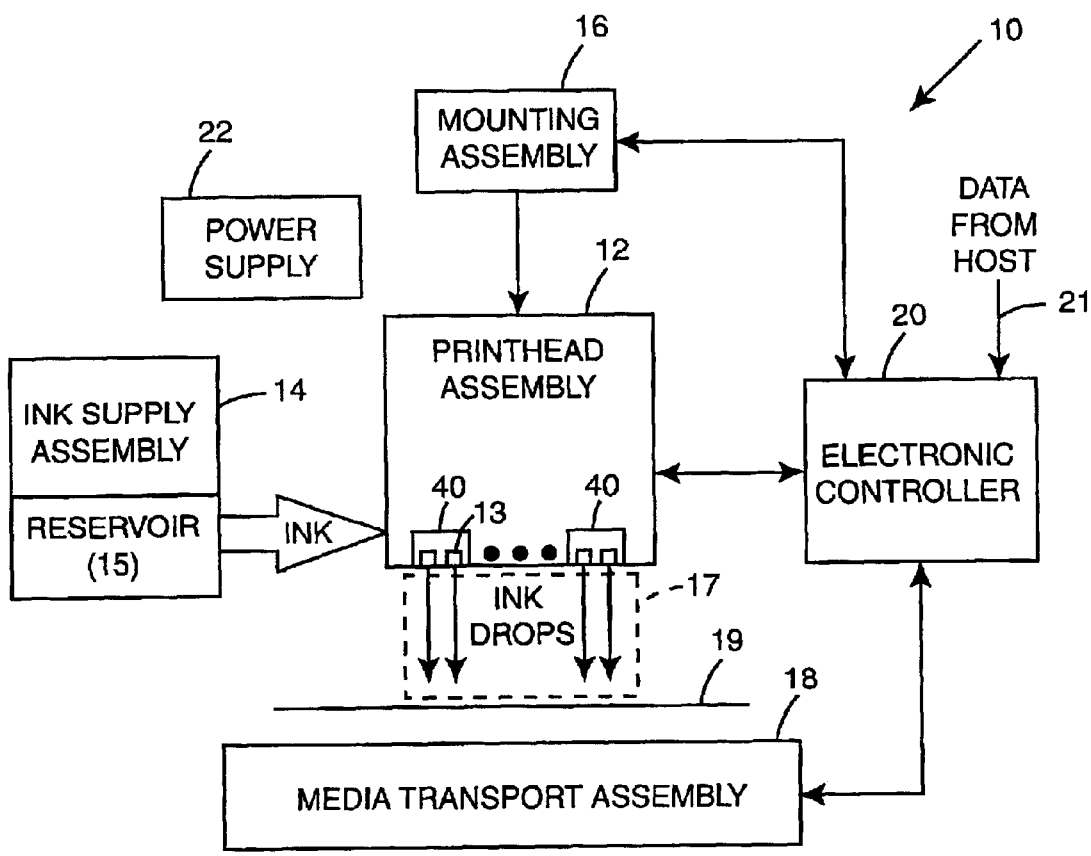
FIG. 1 is a block diagram illustrating one embodiment of a printing system.

In the following detailed description of the preferred embodiments, reference is made to the accompanying drawings which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. The fluid ejection system and related components of the present invention can be positioned in a number of different orientations. As such, the directional terminology is used for purposes of illustration and is in no way limiting. It is to be understood that other embodiments may be utilized and structural or logical changes may be made without departing from the scope of the present invention. Furthermore, the dimensions illustrated in the drawings are not to scale and are for illustration purposes only. The following detailed description, therefore, is not to be taken in a limiting sense, and the scope of the present invention is defined by the appended claims.

FIG. 1 illustrates one embodiment of a fluid ejection system referred to as an inkjet printing system 10 which ejects ink. Other embodiments of fluid ejection systems include printing and non-printing systems, such as medical fluid delivery systems, which eject fluids including liquids, such as water, ink, blood, photoresist, or organic light-emitting materials, or flowable particles of a solid, such as talcum powder or a powered drug.

In one embodiment, the fluid ejection system includes a fluid ejection assembly, such as an inkjet printhead assembly 12; and a fluid supply assembly, such as an ink supply assembly 14. In the illustrated embodiment, inkjet printing system 10 also includes a mounting assembly 16, a media transport assembly 18, and an electronic controller 20. At least one power supply 22 provides power to the various electrical components of inkjet printing system 10. In one embodiment, the fluid ejection assembly includes at least one fluid ejection device, such as at least one printhead or printhead die 40. In the illustrated embodiment, each printhead 40 ejects drops of ink through a plurality of orifices or nozzles 13 and toward a print medium 19 so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes characters, symbols, and/or other graphics or images to be printed upon print medium 19 as inkjet printhead assembly 12 and print medium 19 are moved relative to each other.

Ink supply assembly 14 supplies ink to printhead assembly 12 and includes a reservoir 15 for storing ink. As such, ink flows from reservoir 15 to inkjet printhead assembly 12. Ink supply assembly 14 and inkjet printhead assembly 12 can form either a one-way ink delivery system or a recirculating ink delivery system. In a one-way ink delivery system, substantially all of the ink supplied to inkjet printhead assembly 12 is consumed during printing. In a recirculating ink delivery system, however, only a portion of the ink supplied to printhead assembly 12 is consumed during printing. As such, ink not consumed during printing is returned to ink supply assembly 14.

In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube. In either embodiment, reservoir 15 of ink supply assembly 14 may be removed, replaced, and/or refilled. In one embodiment, where inkjet printhead assembly 12 and ink supply assembly 14 are housed together in an inkjet cartridge, reservoir 15 includes a local reservoir located within the cartridge as well as a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly. As such, mounting assembly 16 includes a carriage for moving inkjet printhead assembly 12 relative to media transport assembly 18 to scan print medium 19. In another embodiment, inkjet printhead assembly 12 is a non-scanning type printhead assembly. As such, mounting assembly 16 fixes inkjet printhead assembly 12 at a prescribed position relative to media transport assembly 18. Thus, media transport assembly 18 positions print medium 19 relative to inkjet printhead assembly 12.

Electronic controller or printer controller 20 typically includes a processor, firmware, and other printer electronics for communicating with and controlling inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical, or other information transfer path. Data 21 represents, for example, a document and/or file to be printed. As such, data 21 forms a print job for inkjet printing system 10 and includes one or more print job commands and/or command parameters.

In one embodiment, electronic controller 20 controls inkjet printhead assembly 12 for ejection of ink drops from nozzles 13. As such, electronic controller 20 defines a pattern of ejected ink drops which form characters, symbols, and/or other graphics or images on print medium 19. The pattern of ejected ink drops is determined by the print job commands and/or command parameters.

In one embodiment, inkjet printhead assembly 12 includes one printhead 40. In another embodiment, inkjet printhead assembly 12 is a wide-array or multi-head printhead assembly. In one wide-array embodiment, inkjet printhead assembly 12 includes a carrier, which carries printhead dies 40, provides electrical communication between printhead dies 40 and electronic controller 20, and provides fluidic communication between printhead dies 40 and ink supply assembly 14.

Figure 2:
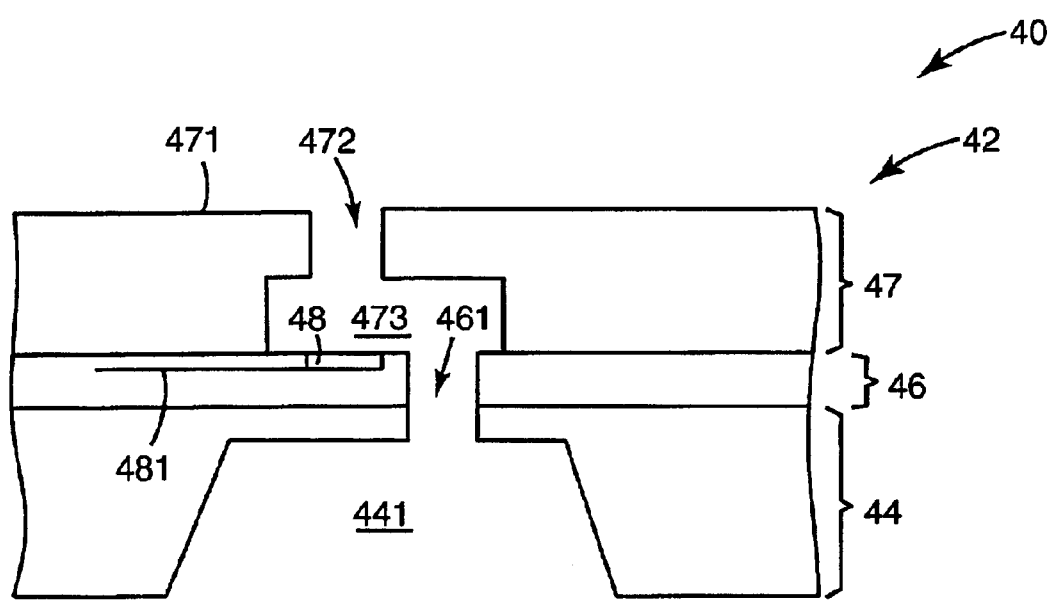
FIG. 2 is an enlarged schematic cross-sectional view illustrating portions of one embodiment of a printhead die in the printing system of FIG. 1.

A portion of one embodiment of a printhead die 40 is illustrated schematically in FIG. 2. Printhead die 40 includes an array of printing or drop ejecting elements 42. Printing elements 42 are formed on a substrate 44 which has an ink feed slot 441 formed therein. As such, ink feed slot 441 provides a supply of liquid ink to printing elements 42. Each printing element 42 includes a thin-film structure 46, an orifice layer 47, and a firing resistor 48. Thin-film structure 46 has an ink feed channel 461 formed therein which communicates with ink feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and ink feed channel 461 of thin-film structure 46. Firing resistor 48 is positioned within nozzle chamber 473 and includes leads 481 which electrically couple firing resistor 48 to a drive signal and ground.

During printing, ink flows from ink feed slot 441 to nozzle chamber 473 via ink feed channel 461. Nozzle opening 472 is operatively associated with firing resistor 48 such that droplets of ink within nozzle chamber 473 are ejected through nozzle opening 472 (e.g., normal to the plane of firing resistor 48) and toward a print medium upon energization of firing resistor 48.

Example embodiments of printhead dies 40 include a thermal printhead, a piezoelectric printhead, a flex-tensional printhead, or any other type of inkjet ejection device known in the art. In one embodiment, printhead dies 40 are fully integrated thermal inkjet printheads. As such, substrate 44 is formed, for example, of silicon, glass, or a stable polymer and thin-film structure 46 is formed by one or more passivation or insulation layers of silicon dioxide, silicon carbide, silicon nitride, tantalum, poly-silicon glass, or other suitable material. Thin-film structure 46 also includes a conductive layer which defines firing resistor 48 and leads 481. The conductive layer is formed, for example, by aluminum, gold, tantalum, tantalum-aluminum, or other metal or metal alloy.

Printhead assembly 12 can include any suitable number (P) of printheads 40, where P is at least one. Before a print operation can be performed, data must be sent to printhead 40. Data includes, for example, print data and non-print data for printhead 40. Print data includes, for example, nozzle data containing pixel information, such as bitmap print data. Non-print data includes, for example, command/status (CS) data, clock data, and/or synchronization data. Status data of CS data includes, for example, printhead temperature or position, printhead resolution, and/or error notification.

Figure 3:
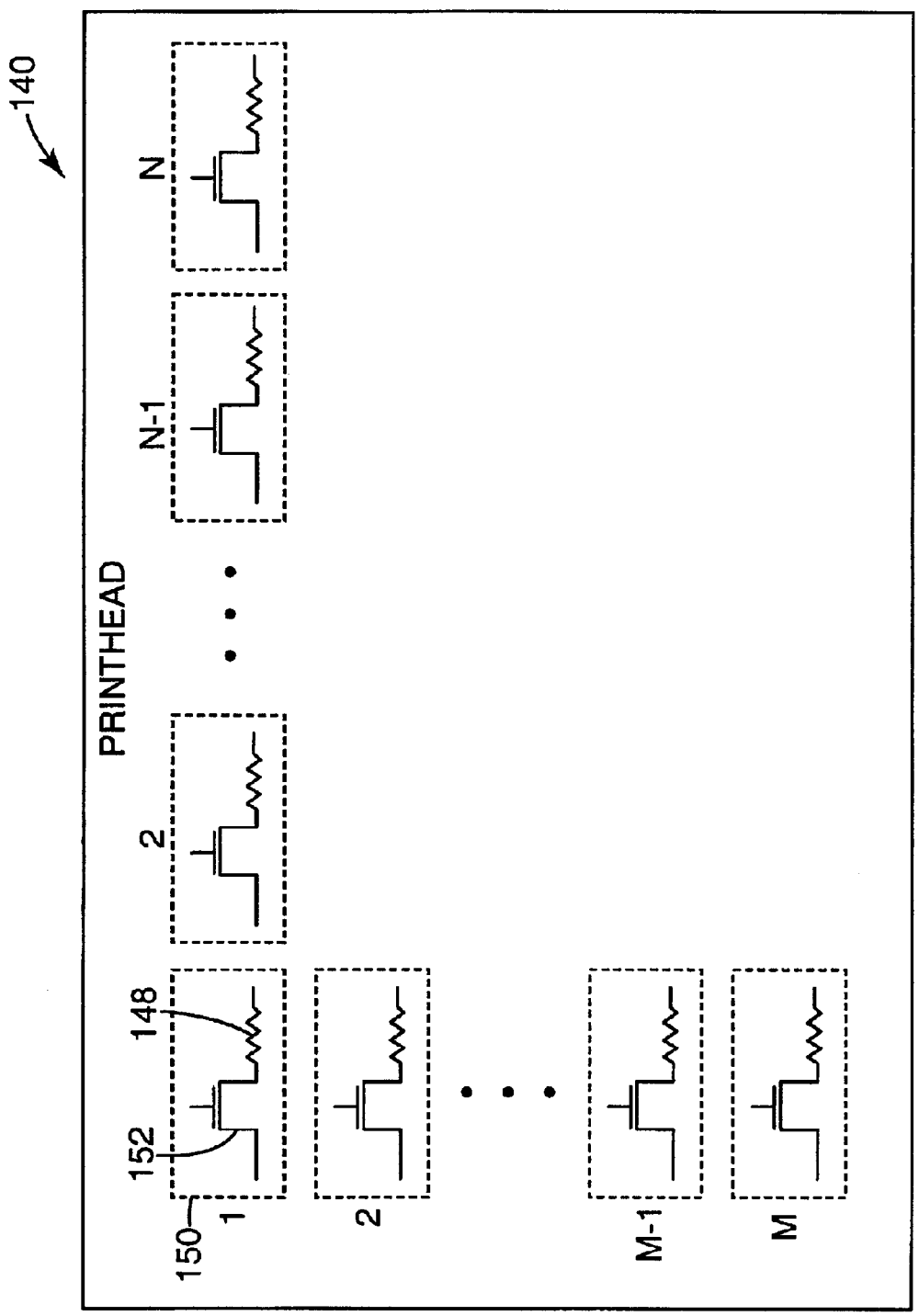
FIG. 3 is a block diagram illustrating portions of one embodiment of a printhead having one or more firing resistors and switching transistors.

One embodiment of an example printhead 140 is illustrated generally in block and schematic diagram form in FIG. 3. Printhead 140 includes multiple firing resistors 148 which are each coupled to a corresponding switching transistor 152. The illustrated configuration of firing resistors 148 and switching transistors 152 is only one of many possible configurations, but the general operation of the switching transistors and firing resistors described below can be applied to other configurations. In one embodiment, switching transistor 152 is a field effect transistor (FET) which is fabricated on a Metal-Oxide Semiconductor (MOS) process, such as a Complementary MOS (CMOS) process. In the embodiments discussed below, switching transistor 152 is an n-channel transistor. In other embodiments, switching transistor 152 is a p-channel transistor.

In the example configuration illustrated in FIG. 3, printhead 140 includes M primitives 150, where each primitive is arranged in a row. Each primitive includes N pairs of firing resistors 148 and switching transistors 152. As a result, the firing resistor/switching transistor pairs are arranged in M rows and N columns which are all coupled to electronic controller 20 in a row/column multiplexing approach, where M is at least one and N is at least one. The drain of each switching transistor 152 is coupled to the associated firing resistor 148. A single lead couples the source of each switching transistor 152 to ground. Alternatively, each switching transistor 152 in each of the M rows are coupled to a separate ground. Each of the N columns of switching transistors 152 is controlled with a separately energizable address lead coupled to every gate of switching transistor 152 in a given column. Each of the M rows forms a primitive wherein each of the M rows of firing resistors 148 is controlled by providing power through a separately energizable primitive lead coupled to every firing resistor 148 in a given primitive row.

By energizing a single address lead and one or more of the up to M primitive leads, only one switching transistor 152 is turned on at a given time in each of the up to M primitive rows so that at most a single firing resistor 148 in each of the primitive rows has electrical current passed through it to heat the ink in a corresponding selected vaporization chamber. The total number of firing resistors 148 having electrical current passed through at a given time is equal to the number of primitive rows being energized.

One example embodiment of the present invention is illustrated generally in FIGS. 4A through 4J which are cross-sectional views illustrating sequentially the switching transistor fabrication method according to the present invention.

Figure 4A:
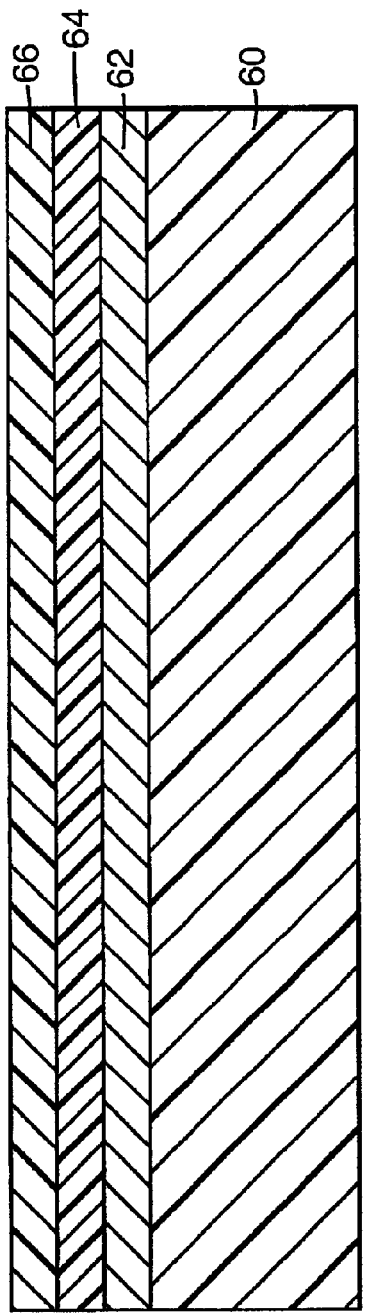

FIG. 4A is a cross-sectional view illustrating the initial film stack which will be etched to define the field regions. In one embodiment, a Stress Relief Oxide (SRO) layer 62 having a defined thickness, such as 600 Angstroms, is formed over semiconductor substrate 60. In one embodiment, a Silicon Nitride layer ($Si_3N_4$) 64 having a defined thickness, such as 1,200 Angstroms, is formed over SRO layer 62. Finally a field photoresist layer 66 is formed over $Si_3N_4$ layer 64. While a p-type substrate is illustrated in this embodiment, the type of substrate used is not restricted to p-type.

Figure 4B:
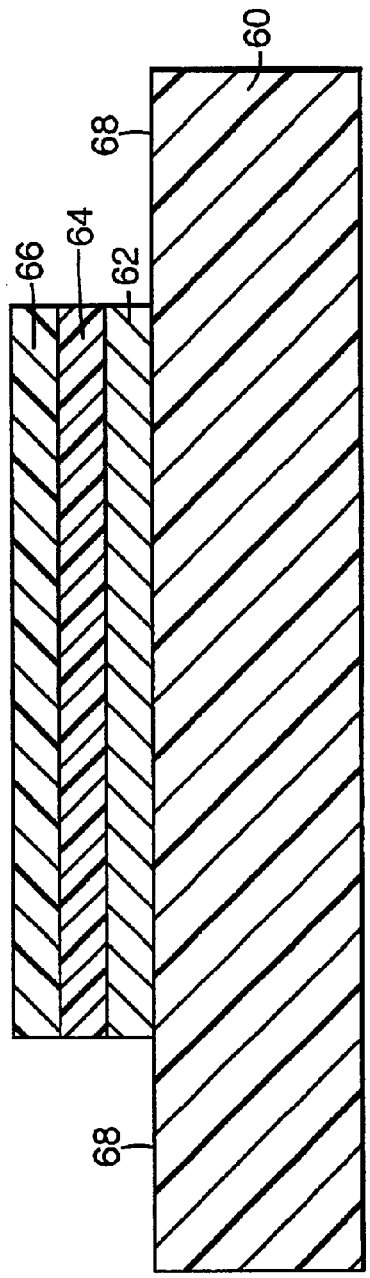

FIG. 4B is a cross-sectional view illustrating field photoresist layer 66, $Si_3N_4$ layer 64, and SRO layer 62 patterned and etched to expose field region 68. In one embodiment, to define field region 68, field photo resist layer 66 is exposed to ultraviolet (UV) light to define the field region which lies outside of the device active area where the FET is formed. Following UV exposure, portions of photoresist layer 66 are removed from field region 68. In one embodiment, the portions of $Si_3N_4$ layer 64 and SRO layer 62 not covered by hardened photoresist after the portions of photoresist layer 66 are removed are etched by using hydrofluoric acid (HF). In alternative embodiments, a chemical solvent such as hydrochloric acid is used, or a dry etch (plasma) process is used to etch the uncovered potions of $Si_3N_4$ layer 64 and SRO layer 62.

FIG. 4C is a cross-sectional view illustrating the field region 68 being doped with an impurity. In one embodiment, the impurity is introduced into field region 68 to establish p-type (acceptor) conductivity. In this embodiment, the impurity type is any p-type acceptor impurity such as Boron. In another embodiment, an n-type (donor) impurity is used to dope field region 68.

After the field region is doped with the impurity, a concentration profile of the doped impurity is established as illustrated by field implant 70. In one embodiment, field implant 70 increases the FET drain to source voltage by increasing the threshold voltage of the parasitic field transistor. In one embodiment, field region 68 is doped with the impurity to create field implant 70 without having to complete an additional photolithography step.

FIG. 4D is a cross-sectional view illustrating the step of removing field photoresist layer 66 to expose $Si_3N_4$ layer 64. $Si_3N_4$ layer 64 is a dielectric material which is used as a barrier against the oxidation of silicon during formation of the field oxide.

FIG. 4E is a cross-sectional view illustrating the formation of field oxide 72. In one embodiment, field oxide 72 is formed to a defined thickness, such as 12,500 Angstroms, through a Local Oxidation of Silicon (LOCOS) process using $Si_3N_4$ layer 64 as an oxidation barrier. In other embodiments, field oxide 72 is not used.

FIG. 4F is a cross-sectional view illustrating the formation of the active area region prior to gate oxidation. In one embodiment, the portion of field oxide 72 over $Si_3N_4$ layer 64 is etched away using HF. Next, $Si_3N_4$ layer 64 is etched away. In one embodiment, a phosphoric acid etch is used. Lastly, SRO layer 62 is etched away to expose surface 74 of semiconductor substrate 60. In one embodiment, SRO layer 62 is etched away using HF.

FIG. 4G is a cross-sectional diagram which illustrates the formation of gate oxide layer 76 and polysilicon layer 78. In one embodiment, gate oxide layer 76 is formed by thermal oxidation to a defined thickness, such as 800 Angstroms. In one embodiment, polysilicon layer 78 is formed by chemical vapor deposition (CVD) to a defined thickness, such as 3,600 Angstroms.

FIG. 4H is a cross-sectional view which illustrates the etching of polysilicon layer 78 and gate oxide layer 76, and the implantation and drive-in of the first dopant or first impurity. In undoped form, polysilicon layer 78 has relatively high resistivity for a gate structure, and as such, in one embodiment is doped with an impurity in order to lower the resistivity to a level suitable for functionality as a gate. In one embodiment, polysilicon layer 78 is doped with phosphorus. In one embodiment, polysilicon layer 78 is doped with PoCl3. In one embodiment, polysilicon layer 78 is doped with arsenic. In one embodiment, polysilicon layer 78 is doped to a resistivity of 30 Ω/square.

Next, polysilicon layer 78 and gate oxide layer 76 are etched to define the gate structure. In one embodiment, a dry etch process is used to define the gate structure. Next, in one embodiment, a source/drain oxidation layer 90 is formed and a drive-in is performed. In one embodiment, an ion implantation and drive-in step is next performed with a first dopant using polysilicon layer 78 as a self-aligned ion implantation mask to create first diffused region 92 and second diffused region 94. In one embodiment, the ion implantation and drive-in step is performed without having to complete an additional photolithography step. In one embodiment, the first dopant is phosphorus. In one embodiment, the first dopant is PoCl3. In one embodiment, the first dopant is arsenic. In other embodiments, other doping techniques are used. In other embodiments, first diffused region 92 is formed to have a portion which extends under field oxide 72 (see also, first diffused region 128 illustrated in FIG. 6B). In one embodiment, first diffused region 92 and second diffused region 94 are doped to a defined resistivity, such as greater than 12 Ω/square. Once the ion implantation step with the first dopant is complete, a channel region 88 is thereby defined.

After the gate structure is formed, and after the source and drain diffusions are completed (see also, FIG. 4I), the FET will be formed. The partially formed FET, illustrated generally at 80, has a source 82, a gate 84, and a drain 86.

Although FET 80 in the embodiments illustrated in FIG. 4H is an n-channel device, and as such, the first dopant or first impurity is n-type, in other embodiments, the first dopant or first impurity is p-type if the FET device being formed is a p-channel device.

Figure 4I:
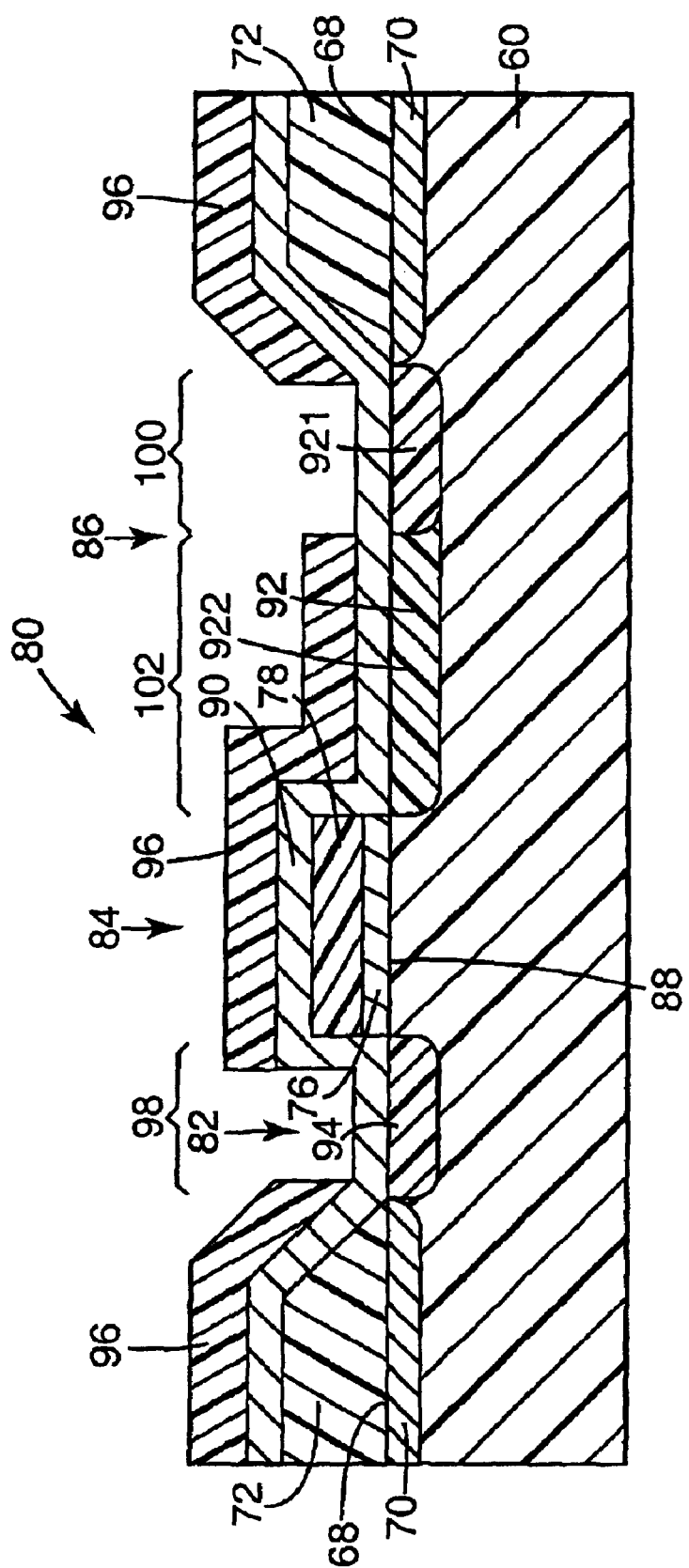

FIG. 4I is a cross-sectional view illustrating the definition of the implant regions created by implantation and drive-in of the second dopant or second impurity after the deposition, patterning and etching of photoresist layer 96 has been completed. Photoresist layer 96 is etched to expose areas 98 and 100 which define the regions where the surface of semiconductor substrate 60 will be implanted by the second dopant. In one embodiment, the second dopant is phosphorus. In one embodiment, the second dopant is PoCl3. In one embodiment, the second dopant is arsenic. In other embodiments, other doping techniques are used.

After the second ion implantation and drive-in is completed, second diffused region 94 and first portion 921 of first diffused region 92 will have a greater impurity concentration than the impurity concentration of second portion 922 of first diffused region 92. After the second ion implantation step, drain 86 has two implant regions. First portion 921 of first diffused region 92, which is indicated at area 100, in one embodiment is doped to a defined resistivity, such as 12 Ω/square. In one embodiment, second diffused region 94 is also doped to a defined resistivity, such as 12 Ω/square. Second portion 922 of first diffused region 92, which is indicated at area 102, in one embodiment is doped to a defined resistivity, such as greater than 12 Ω/square.

Electrical contact is made to FET 80 at first portion 921 of first diffused region 92 of drain 86 and second diffused region 94 of source 82 so that electrical current flows between first portion 921 and second diffused region 94. The physical structure of drain 86 is such that first portion 921 has a greater distance from channel region 88 than second portion 922. As illustrated in FIG. 4I, area 102 (or second portion 922 of first diffused region 92) is positioned between channel region 88 and area 100 (or first portion 921 of first diffused region 92). Because the first ion implantation and drive-in with the first dopant is completed using polysilicon layer 78 as a self-aligned ion implantation mask, second portion 922 is adjacent to channel region 88. In one embodiment, second portion 922 increases the FET 80 drain to source voltage by extending the length of drain 86 and thus permitting the depletion region of first portion 921 to extend into second portion 922, thereby increasing the drain 86 to source 82 punch-through voltage, and the avalanche breakdown voltage of the first portion 921 drain junction. In one embodiment, the FET 80 drain to source voltage is increased because the resistance of second portion 922 increases the gate oxide breakdown voltage by reducing the electric field at channel region 88.

Although FET 80 in the embodiments illustrated in FIG. 4I is an n-channel device, and as such, the second dopant or second impurity is n-type, in other embodiments, the second dopant or second impurity is p-type if the FET device being formed is a p-channel device.

Figure 4J:
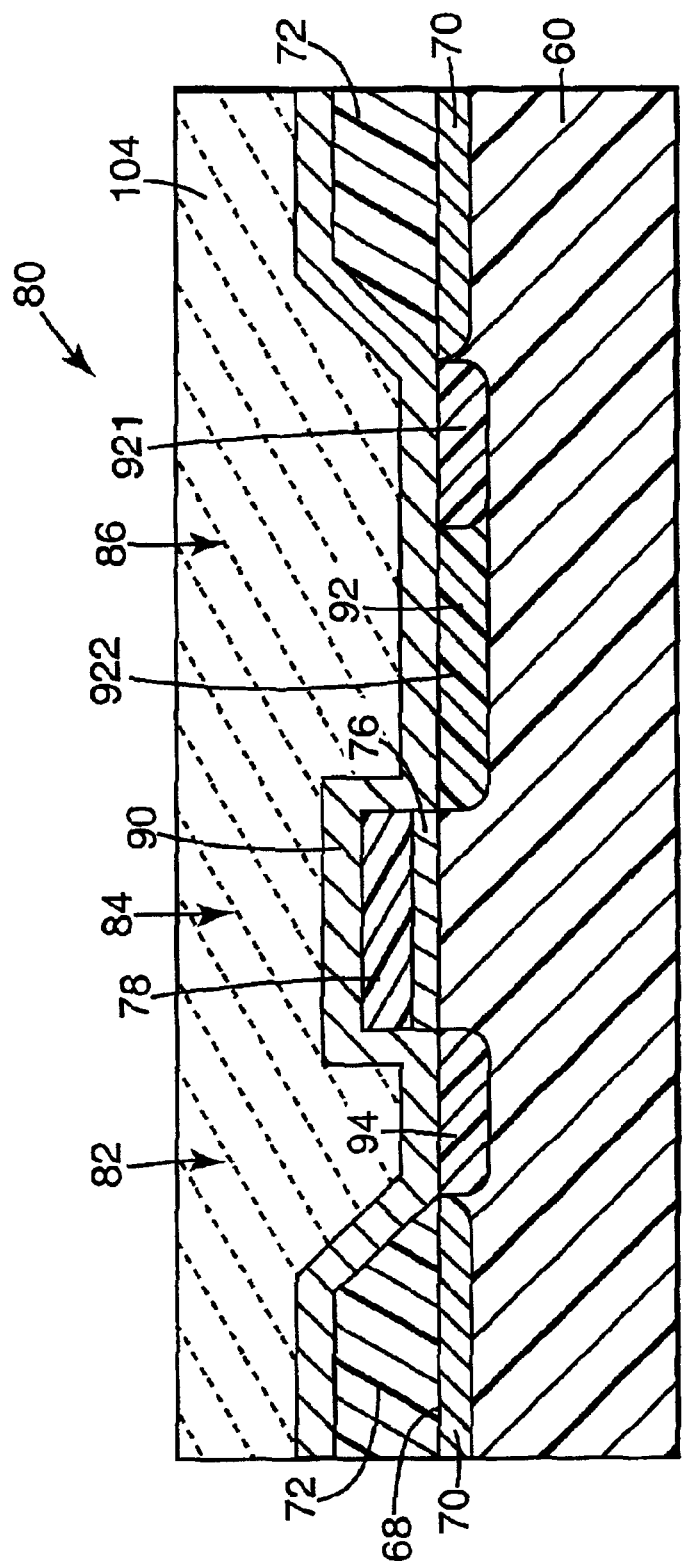

FIG. 4J is a cross-sectional view illustrating the final steps of formation of FET 80. After the ion implantation and drive-in steps are completed, photoresist layer 96 is removed. In one embodiment, a layer 104 of phosphosilicate glass (PSG) is formed over FET 80.

Figure 5:
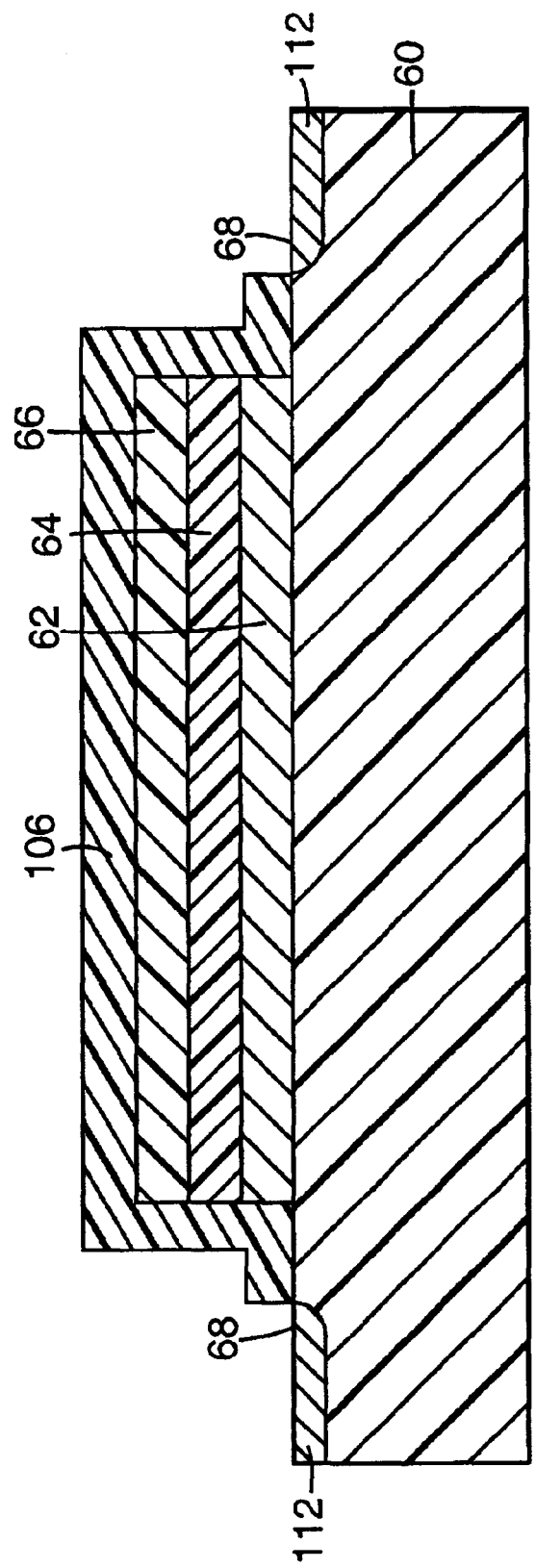
FIG. 5 is a cross-sectional view that illustrates the switching transistor fabrication method according to embodiments of the present invention.

FIG. 5 is a cross-sectional view which illustrates the switching transistor fabrication method according to one embodiment of the present invention. FIG. 5 illustrates a portion of field region 68 being doped with an impurity concentration which is greater than the impurity concentration of semiconductor substrate 60. In one embodiment, to dope the portion of field region 68, a photoresist layer 106 is patterned and etched to define the portions of field region 68 to be implanted. Partial field implant 112 illustrates the doping profile of the portion of the field being doped or implanted. In this embodiment, there is a space between partial field implant 112 and SRO layer 62. In one embodiment, this spacing between partial field implant 112 and SRO layer 62 increases the FET drain to source voltage by reducing the doping concentration of field region 68 near the later-formed FET junctions thereby increasing the parasitic field transistor junction avalanche breakdown voltage. In one embodiment, partial field implant 112 increases the FET drain to source voltage by increasing the threshold voltage of the parasitic field transistor. This embodiment follows the fabrication sequence illustrated by FIGS. 4A–4B and 4D–4J, with the step illustrated in FIG. 5 replacing the step of FIG. 4C.

Figure 6A:
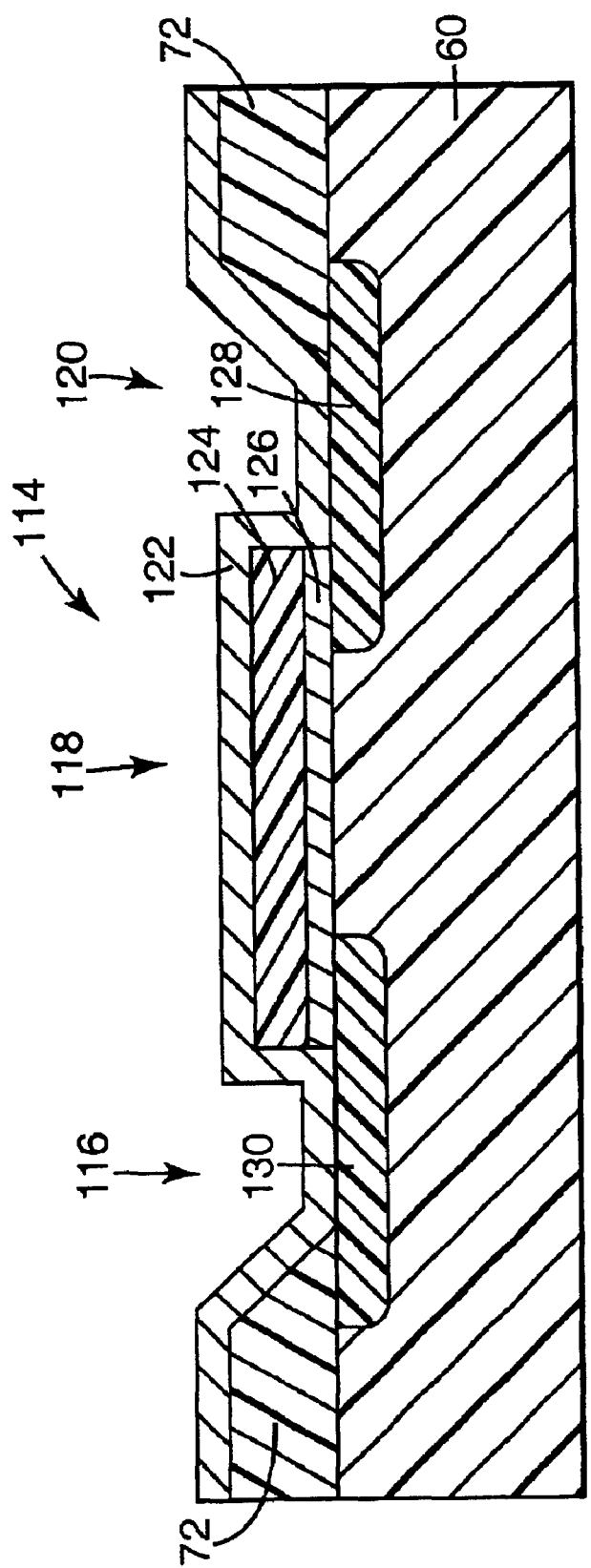
FIGS. 6A–6B are cross-sectional views that illustrate sequentially the switching transistor fabrication method according to embodiments of the present invention.
Figure 6B:
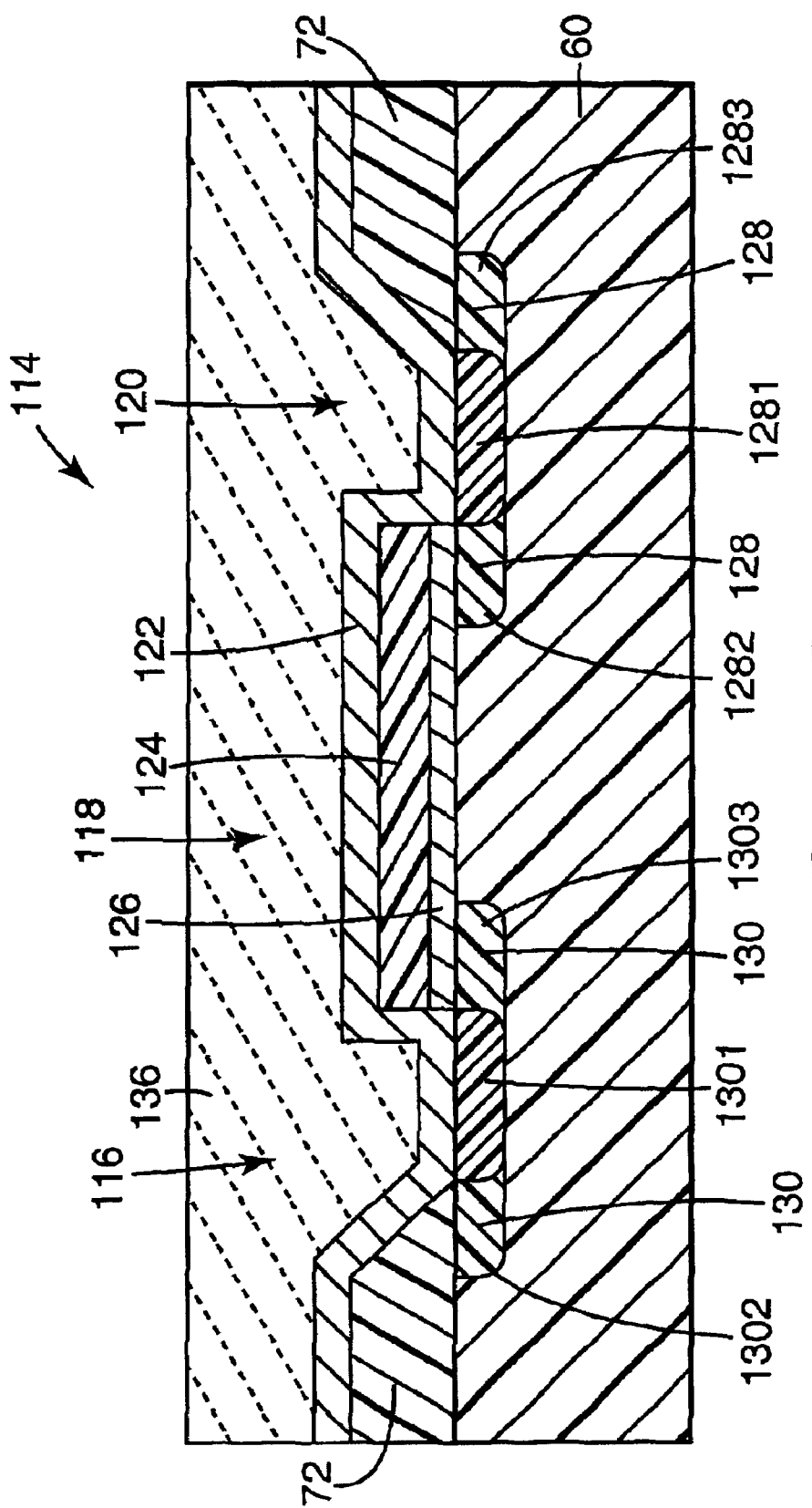

FIGS. 6A and 6B are cross-sectional views which illustrate additional embodiments of the present invention. FIG. 6A illustrates a partially formed FET device 114 having a source 116, a gate 118, and a drain 120. While the specific dimensions of drain 120 are not necessary to practice the present invention, in one embodiment, drain 120 as illustrated in FIG. 6A has the same dimensions as source 116.

In one example embodiment, the fabrication steps illustrated in FIGS. 4A–4G are completed. Next, in regards to FIG. 6A, polysilicon layer 124 has relatively high resistivity, and as such, in one embodiment is doped with an impurity in order to lower the resistivity to a level suitable for functionality as a gate. In one embodiment, polysilicon layer 124 is doped with phosphorus. In one embodiment, polysilicon layer 124 is doped with PoCl3. In one embodiment, polysilicon layer 124 is doped with arsenic. In one embodiment, polysilicon layer 124 is doped to a defined resistivity, such as 30 Ω/square.

Next, polysilicon layer 124 and gate oxide layer 126 are etched to define the gate structure. In one embodiment, a dry etch process is used to define the gate structure. Next, in one embodiment, a source/drain oxidation layer 122 is formed and a drive-in is performed. In one embodiment, an ion implantation and drive-in step is next performed with a first dopant using polysilicon layer 124 as a self-aligned ion implantation mask to create first diffused region 128 and second diffused region 130. In this embodiment, the ion implantation and drive-in step is performed without having to complete an additional photolithography step. In one embodiment, the first dopant is phosphorus. In one embodiment, the first dopant is PoCl3. In one embodiment, the first dopant is arsenic. In other embodiments, other doping techniques are used.

Once the ion implantation and drive-in step with the first dopant is completed, a high temperature diffusion processing step is undertaken which diffuses the atoms of the first dopant further into semiconductor substrate 60 to achieve the doping profiles illustrated by first diffused region 128 and second diffused region 130. In one embodiment, the high temperature diffusion process step includes a defined oxidation and anneal, such as for 25 minutes at 1000° C. In one embodiment, the first diffused region 128 and second diffused region 130 have a defined resistivity, such as greater than 12 Ω/square, after the high temperature diffusion processing step is complete.

Although in the embodiments illustrated in FIG. 6A, FET 114 is an n-channel device and as such the first dopant or first impurity is n-type, in other embodiments, the first dopant or first impurity is p-type if the FET device being formed is a p-channel transistor.

FIG. 6B is a cross-section of FET 114 illustrating a profile of the second dopant after implant using polysilicon layer 124 as a self-aligned ion implantation mask. An ion implantation and drive-in step is performed with the second dopant using polysilicon layer 124 as a self-aligned ion implantation mask to create first portion 1281 of first diffused region 128 and first portion 1301 of second diffused region 130. In one embodiment, the first dopant is phosphorus. In one embodiment, the first dopant is PoCl3. In one embodiment, the first dopant is arsenic. In other embodiments, other doping techniques are used. After this second ion implantation and drive-in is completed, first portion 1281 of first diffused region 128 and first portion 1301 of second diffused region 130 will have a greater impurity concentration than second portion 1282 or second portion 1283 of first diffused region 128 or second portion 1302 or second portion 1303 of second diffused region 130. In one embodiment, first portion 1281 of first diffused region 128 and first portion 1301 of second diffused region 130 are doped to a defined resistivity, such as 12 Ω/square. After the second ion implantation and drive-in is completed, in one embodiment, a layer 136 of PSG is formed over FET 114.

Electrical contact is made to FET 114 at first portion 1281 of first diffused region 128 of drain 120 and first portion 1301 of second diffused region 130 of source 116 so that electrical current flows between first portion 1281 and first portion 1301. In one embodiment, second portion 1282 and second portion 1283 increase the FET 114 drain to source voltage by permitting the depletion region of the first portion 1281 junction to extend into second portion 1282 and second portion 1283, thereby increasing the drain 120 to source 116 punch-through voltage, and the avalanche breakdown voltage of first portion 1281.

Although in the embodiments illustrated in FIG. 6B, FET 114 is an n-channel device and as such the second dopant or second impurity is n-type, in other embodiments, the second dopant or second impurity is p-type if the FET device being formed is a p-channel transistor.

In another example embodiment, the fabrication steps illustrated in FIGS. 4A–4B and FIGS. 4D–4G are completed. Next, in regards to FIG. 6A, polysilicon layer 124 and gate oxide layer 126 are etched to define the gate structure. In one embodiment, a dry etch process is used to define the gate structure. In one embodiment, an ion implantation and drive-in step is next performed with a first dopant using polysilicon layer 124 as a self-aligned ion implantation mask to create first diffused region 128 and second diffused region 130. In this embodiment, the ion implantation and drive-in step is performed without having to complete an additional photolithography step. In one embodiment, the first dopant is phosphorus. In one embodiment, the first dopant is PoCl3. In one embodiment, the first dopant is arsenic. In one embodiment, polysilicon layer 124 is doped with an impurity to lower the resistivity to a level suitable for functionality as a gate. In one embodiment, polysilicon layer 124 is doped with phosphorus. In one embodiment, polysilicon layer 124 is doped with PoCl3. In one embodiment, polysilicon layer 124 is doped with arsenic. In one embodiment, polysilicon layer 124 is doped to a defined resistivity, such as 30 Ω/square. In one embodiment, polysilicon layer 124 is doped at the same time as first diffused region 128 and second diffused region 130.

Next, in one embodiment, a source/drain oxidation layer 122 is formed and a drive-in is performed. In one embodiment, a high temperature diffusion processing step is next undertaken which diffuses the atoms of the first dopant further into semiconductor substrate 60 to achieve the doping profiles illustrated by first diffused region 128 and second diffused region 130. In one embodiment, the high temperature diffusion process step includes a defined oxidation and anneal, such as for 25 minutes at 1000° C. In one embodiment, the first diffused region 128 and second diffused region 130 have a defined resistivity, such as greater than 12 Ω/square after the high temperature diffusion processing step is complete.

Although in the embodiments illustrated in FIG. 6A, FET 114 is an n-channel device and as such the first dopant or first impurity is n-type, in other embodiments, the first dopant or first impurity is p-type if the FET device being formed is a p-channel transistor.

FIG. 6B is a cross-section of FET 114 illustrating a profile of the second dopant after implant using polysilicon layer 124 as a self-aligned ion implantation mask. In one embodiment, an ion implantation and drive-in step is next performed with a second dopant using polysilicon layer 124 as a self-aligned ion implantation mask to create first portion 1281 of first diffused region 128 and first portion 1301 of second diffused region 130. In one embodiment, the first dopant is phosphorus. In one embodiment, the first dopant is PoCl3. In one embodiment, the first dopant is arsenic. After this second ion implantation and drive-in is completed, first portion 1281 of first diffused region 128 and first portion 1301 of second diffused region 130 will have a greater impurity concentration than second portion 1282 or second portion 1283 of first diffused region 128 or second portion 1302 or second portion 1303 of second diffused region 130. In one embodiment, first portion 1281 of first diffused region 128 and first portion 1301 of second diffused region 130 are doped to a defined resistivity, such as 12 Ω/square. After the second ion implantation and drive-in is completed, in one embodiment, a layer 136 of PSG is formed over FET 114.

Electrical contact is made to FET 114 at first portion 1281 of first diffused region 128 of drain 120 and first portion 1301 of second diffused region 130 of source 116 so that electrical current flows between first portion 1281 and first portion 1301. In one embodiment, second portion 1282 and second portion 1283 increase the FET 114 drain to source voltage by permitting the depletion region of the first portion 1281 junction to extend into second portion 1282 and second portion 1283, thereby increasing the drain 120 to source 116 punch-through voltage, and the avalanche breakdown voltage of first portion 1281.

Although in the embodiments illustrated in FIG. 6B, FET 114 is an n-channel device and as such the second dopant or second impurity is n-type, in other embodiments, the second dopant or second impurity is p-type if the FET device being formed is a p-channel transistor.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments illustrated and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of manufacturing a power switching transistor for a fluid ejection device, the method comprising:

forming a diffused drain region and a diffused source region separated by a channel region;

doping the diffused drain region and the diffused source region with a first dopant; and doping a first portion of the diffused drain region with a second dopant, wherein the first portion of the diffused drain region has a greater impurity concentration than at least a second portion of the diffused drain region and has a greater impurity concentration than the diffused source region.

2. The method of claim 1 further comprising:

doping the first portion of the diffused drain region with the second dopant such that the first portion of the diffused drain region is located a greater distance from the channel region than the second portion of the diffused drain region.

3. The method of claim 1, wherein the power switching transistor is formed on a semiconductor substrate, and wherein doping the diffused drain region and the diffused source region with a first dopant further includes diffusing the first dopant into the semiconductor substrate.

4. The method of claim 1, wherein the power switching transistor is formed on a semiconductor substrate, the method further comprising:

defining a field region wherein the diffused drain region is located outside of the field region and at least a portion of the field region is doped to produce an impurity concentration that is greater than the impurity concentration of the semiconductor substrate.

5. The method of claim 4, wherein the field region is doped with a p-type impurity.

6. The method of claim 4, wherein the field region is doped with an n-type impurity.

7. The method of claim 1, wherein the first dopant and the second dopant are n-type.

8. The method of claim 1, wherein the first dopant and the second dopant are p-type.

* * * * *